United States Patent
Collins, III et al.

(10) Patent No.: US 9,046,565 B2
(45) Date of Patent: Jun. 2, 2015

(54) BUILT-IN SELF-TEST FOR RADIO FREQUENCY SYSTEMS

(75) Inventors: Thomas E. Collins, III, Tyngsboro, MA (US); Gregory M. Flewelling, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 791 days.

(21) Appl. No.: 13/220,154

(22) Filed: Aug. 29, 2011

(65) Prior Publication Data

US 2013/0049780 A1     Feb. 28, 2013

(51) Int. Cl.
*G01R 31/28*     (2006.01)
*G01R 31/3187*   (2006.01)

(52) U.S. Cl.
CPC ........ *G01R 31/2822* (2013.01); *G01R 31/3187* (2013.01)

(58) Field of Classification Search
None
See application file for complete search history.

(56) References Cited

U.S. PATENT DOCUMENTS

| 5,644,243 A * | 7/1997 | Reinhardt et al. ............ 324/626 |
| 7,428,683 B2 | 9/2008 | Dai et al. |
| 2005/0260963 A1* | 11/2005 | Ponce De Leon et al. . 455/226.3 |
| 2008/0086668 A1* | 4/2008 | Jefferson et al. ............. 714/741 |
| 2010/0120369 A1* | 5/2010 | Ko et al. .................... 455/67.11 |
| 2010/0141269 A1* | 6/2010 | Quan .......................... 324/622 |
| 2010/0177811 A1* | 7/2010 | Duerdodt et al. ............ 375/224 |

OTHER PUBLICATIONS

Wikipedia, the free encyclopedia, "Built-in self-test", http://en.wikipedia.org/wiki/Built-in_self test, printed on Aug. 29, 2011, 4 pgs.
Wikipedia, the free encyclopedia, "Ring oscillator", http://en.wikipedia.org/wiki/Ring_oscillator, printed on Aug. 29, 2011, 3 pgs.

* cited by examiner

*Primary Examiner* — Melissa Koval
*Assistant Examiner* — Stephen G Armstrong
(74) *Attorney, Agent, or Firm* — Finch & Maloney PLLC (57) ABSTRACT

Techniques for performing built-in self-test (BIST) of performance of an RF system are disclosed. The techniques may be used, for example, for measuring distortion generated by the RF system under test, detecting faults in the system, determining calibration of the system, and/or assisting in compensating analog circuitry that is sensitive to temperature, supply voltage, and/or process variations. Also, a BIST architecture for determining RF performance of an RF systems is disclosed.

18 Claims, 6 Drawing Sheets

BUILT-IN SELF-TEST FOR RADIO FREQUENCY SYSTEMS

STATEMENT OF GOVERNMENT INTEREST

The invention was made with United States Government support under contract FA8650-09-C-7926 awarded by the United States Air Force. The United States Government has certain rights in this invention.

FIELD OF THE DISCLOSURE

The invention relates to radio frequency systems, and more particularly, to built-in self-testing of radio frequency systems.

BACKGROUND

A built-in self-test (BIST) is capability that permits a system to test itself. A BIST may result in faster, less expensive manufacturing tests, and may reduce the complexity of a system, thereby decreasing cost and reducing reliance upon external testing equipment. In addition, BIST capability may provide for higher reliability and/or lower repair cycle times in a given system. Depending on the system being tested, there are a number of non-trivial issues that can arise which complicate the reliability of the BIST.

SUMMARY

One embodiment of the present invention provides a method of performing a built-in self-test. The method includes generating an analog radio frequency stimulus signal via oscillator circuitry, applying the stimulus signal to a device under test (DUT) configured with a frequency conversion stage including at least one of a mixer and a local oscillator, and analyzing an output signal of the DUT responsive to the stimulus signal for desired performance qualities. In one example case, at least a portion of the method is performed during manufacturing of the DUT. In another example case, at least a portion of the method is performed during field testing of the DUT. In another example case, the DUT is a system-on-chip and at least a portion of the method is performed on-chip. In another example case, the oscillator circuitry is included in a plurality of phase-locked loops and is configured to generate a corresponding plurality of test tones that are included in the stimulus signal. In another example case, the stimulus signal is unmodulated. In one such case, the stimulus signal is a continuous wave tone. In another example case, the frequency conversion stage is constructed and arranged to downconvert the stimulus signal. In another example case, prior to analyzing the output signal of the DUT, the method further includes converting the output signal to a form suitable for analysis. In another example case, converting the output signal to a form suitable for analysis includes converting the output signal to a digital signal. In another example case, analyzing the output signal of the DUT comprises measuring intermodulation distortion generated by the DUT. In another example case, analyzing the output signal of the DUT comprises at least one of detecting faults in the DUT, determining calibration of the DUT, and compensating for DUT circuitry that is sensitive to one or more of temperature, supply voltage, and process variations.

Another embodiment of the present invention provides a device for performing a built-in self-test. The device includes oscillator circuitry for generating an analog radio frequency stimulus signal. The device further includes a device under test (DUT) for receiving the stimulus signal, the DUT including a frequency conversion stage including at least one of a mixer and a local oscillator. The device further includes an analyzer for analyzing an output signal of the DUT responsive to the stimulus signal for desired performance qualities. In one example case, the device is a system-on-chip and at least a portion the built-in self-test is performed on-chip. In another example case, the oscillator circuitry is included in a plurality of phase-locked loops and is configured to generate a corresponding plurality of test tones that are included in the stimulus signal via a summer included in the device. In another example case, the frequency conversion stage is constructed and arranged to downconvert the stimulus signal. In another example case, the device further includes circuitry for converting the output signal to a form suitable for analysis by the analyzer. In another example case, the analyzer is configured for at least one of measuring intermodulation distortion generated by the DUT, detecting faults in the DUT, determining calibration of the DUT, and compensating for DUT circuitry that is sensitive to one or more of temperature, supply voltage, and process variations. Any number of variations will be apparent.

For instance, another embodiment of the present invention provides a device for performing a built-in self-test. In this example case, the device includes oscillator circuitry for generating an analog radio frequency stimulus signal. The device further includes a device under test (DUT) for receiving the stimulus signal, and including a frequency conversion stage including at least one of a mixer and a local oscillator. The device further includes circuitry for converting an output signal of the DUT responsive to the stimulus signal to a form suitable for analysis. The device further includes an analyzer for analyzing the output signal for desired performance qualities. The device is a system-on-chip and at least a portion the built-in self-test is performed on-chip. In one such example case, the oscillator circuitry is included in a plurality of phase-locked loops and is configured to generate a corresponding plurality of test tones that are included in the stimulus signal via a summer included in the device.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Techniques are disclosed for performing a built-in self-test (BIST) of a device under test (DUT) to determine the radio frequency (RF) performance thereof. The techniques can be implemented, for example, to measure distortion generated by the DUT, detect faults in the DUT, determine calibration of the DUT, and/or assist in compensating analog circuitry that is sensitive to temperature, supply voltage, and/or process variations. Such techniques may be employed during, for instance, manufacturing, field testing, and/or regular use. Furthermore, in some cases such techniques may offer a high degree of reliability and result in faster, less expensive testing. The techniques provided herein may be implemented, for example, to verify performance of a given RF system in part or in total. Also, such techniques may be implemented in part or in whole in a system-on-chip or chip set configuration, or as discrete components populated on a printed circuit board. Numerous configurations and variations will be apparent in light of this disclosure.

General Overview

Figure 1:
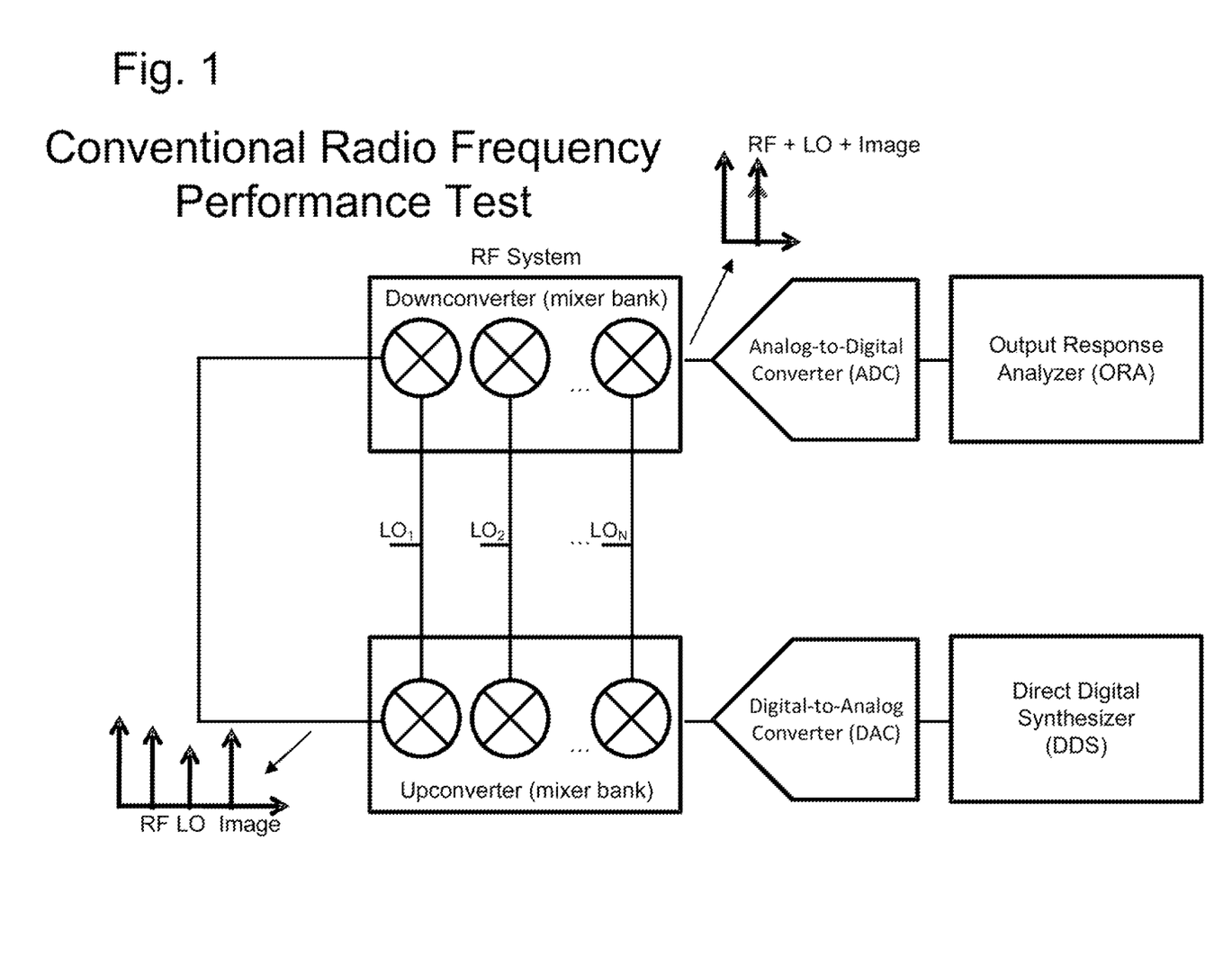
FIG. 1 illustrates a schematic view of an example approach to performing a test of the radio frequency performance of a device under test.
Figure 2:
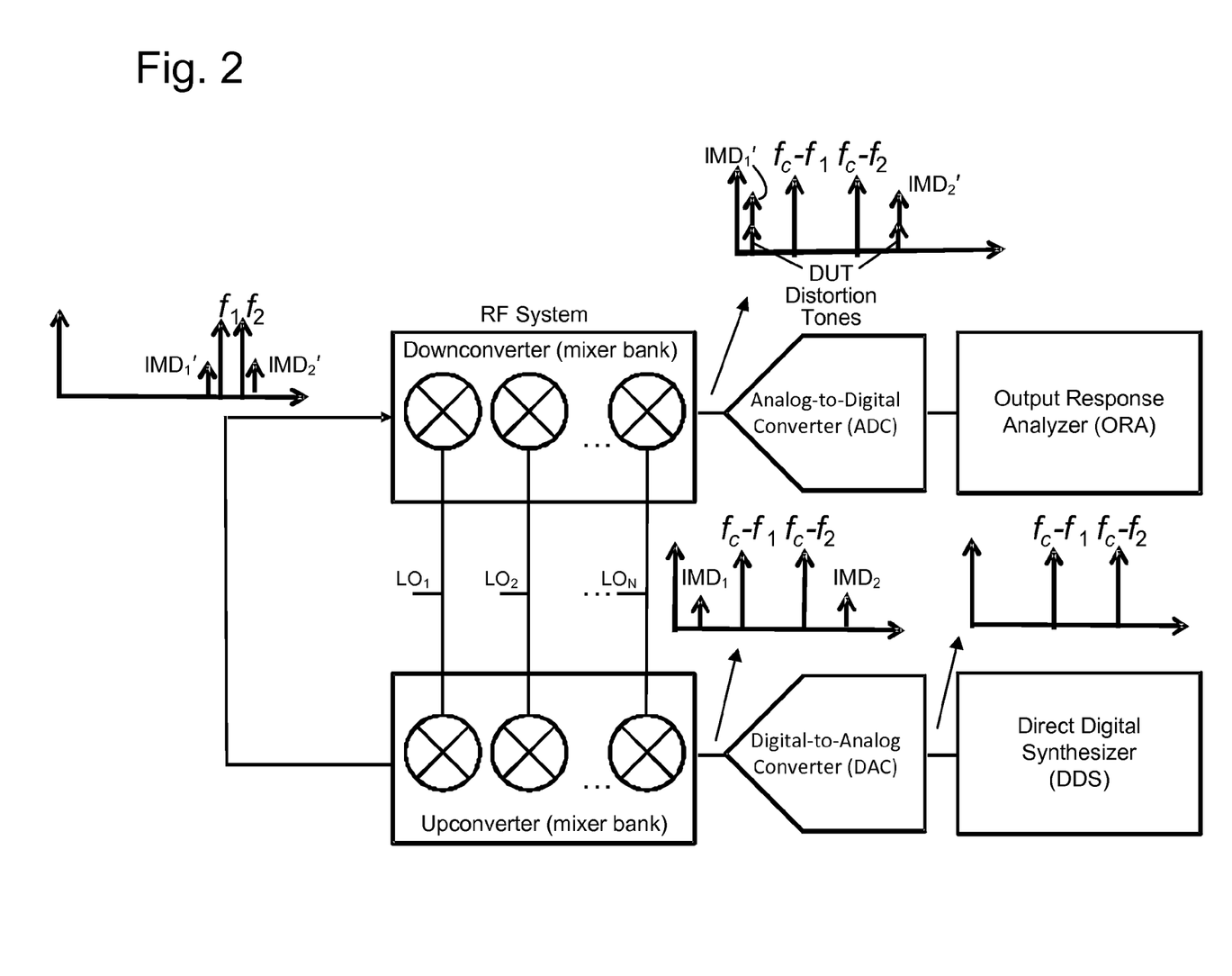
FIG. 2 illustrates a schematic view of another example approach to performing a test of the radio frequency performance of a device under test.

As previously indicated, there are a number of non-trivial issues that can arise which complicate the reliability of the BIST capability. For instance, FIGS. 1 and 2 illustrate schematic views of one possible approach to performing a test of the RF performance of a device. In general, the approach includes generating a digital baseband stimulus signal via a direct digital synthesizer (DDS), converting that digital signal to its analog equivalent by way of a digital to analog converter (DAC), upconverting the frequency of the resulting analog baseband stimulus signal to the RF range by passing it through one or more mixers each operatively coupled with a suitable local oscillator (LO) signal, and applying the resultant RF test signal to stimulate the RF system under test. The RF system under test in this example case includes a downconverter configured with one or more mixers, for downconverting received RF signal down to the intermediate frequency range. The BIST further includes measuring the output of the RF system under test by way of the output response analyzer (ORA) to determine proper functionality and performance.

A number of complications arise from such an approach. For instance, and as best shown in FIG. 1, the upconversion process generally leaves both LO leakage and image signals in the stimulus signal. Thus, after the downconversion process through the RF system under test, the image signal lands on top of the desired signal thereby causing distortion in the BIST measurement carried out by the output response analyzer. In addition, and as best shown in FIG. 2, intermodulation distortion products can be introduced by both the DAC and the upconverter. In more detail, the DDS generates a digital baseband stimulus signal, represented by $f_c$-$f_1$ and $f_c$-$f_2$, where $f_1$ and $f_2$ are arbitrary test tones and $f_c$ is the aggregate conversion frequency created through the system. Passing this stimulus signal through the DAC introduces intermodulation distortion, represented by $IMD_1$ and $IMD_2$. The resultant distorted stimulus signal then is passed through the upconverter, where further distortion is introduced as generally indicated by $IMD_1'$ and $IMD_2'$ (note that $IMD_1'$ and $IMD_2'$ are larger in magnitude than $IMD_1$ and $IMD_2$ to show compounded distortion). The distorted stimulus signal, including $IMD_1'$ and $IMD_2'$, is then passed through the downconverter of the RF system under test which introduces DUT distortion tones (as further shown in FIG. 2) to the already-distorted analog baseband stimulus signal. The output signal of the RF system under test is passed through the ADC and to an ORA, where the output signal is analyzed. Thus, after downconversion process through the RF system under test, the IMD tones to be measured are the result of not only the RF system under test, but also the DAC and the RF upconverter.

In accordance with an embodiment of the present invention, the digital-to-analog conversion and frequency upconversion processes are eliminated which in turn eliminates the intermodulation distortion and image signal problems associated therewith. In one example case, the stimulus signal is generated not by a DDS/DAC/upconverter combination, but by using one or more phase locked loops (PLLs) or a switchable ring oscillator or other suitable oscillator circuit. In general, a PLL is a common circuit in RF systems and typically includes a voltage controlled oscillator (e.g., which can be implemented, for instance, as a ring oscillator, Colpitts oscillator, source-coupled oscillator, grounded-capacitor oscillator, emitter-coupled oscillator, or any other suitable type of oscillator circuitry), which can be used in both normal RF receiver mode as well as in the BIST mode. Alternatively, a dedicated multi-loop or switchable oscillator circuit can be provided to carry out the BIST mode. The one or more PLLs (or oscillator circuitry) allows for generation of arbitrary stimulus signals without the problem of image signals discussed with reference to FIG. 1 or the problem of IMD discussed with reference to FIG. 2. As such, the one or more PLLs or oscillator circuitry allow the true intermodulation distortion signal of the system under test to be sampled, converted to its digital equivalent, and measured or otherwise analyzed by the digital output response analyzer.

Because the stimulus signal is generated in the analog domain and the DUT output signal responsive to that stimulus signal is analyzed in the digital domain, this technique is generally referred to herein as a hybrid analog-digital BIST. Other benefits of such a hybrid technique will be apparent in light of this disclosure. For instance, any number of problems generally associated with the generation of a digital stimulus signal via the DDS, converting that stimulus signal from digital to analog via the DAC, and/or upconverting the frequency of that stimulus signal via the upconverter can be eliminated. In addition, the PLLs or oscillator circuitry that effectively replace the DDS, DAC, and upconverter circuits can generally be implemented with relatively compact and inexpensive circuitry that can be implemented, for instance, using conventional fabrication processes that readily integrate or are otherwise compatible with processes used to fabricate the system under test (such as complementary metal oxide semiconductor processes and other such integrated circuit forming processes).

System Architecture

Figure 3:
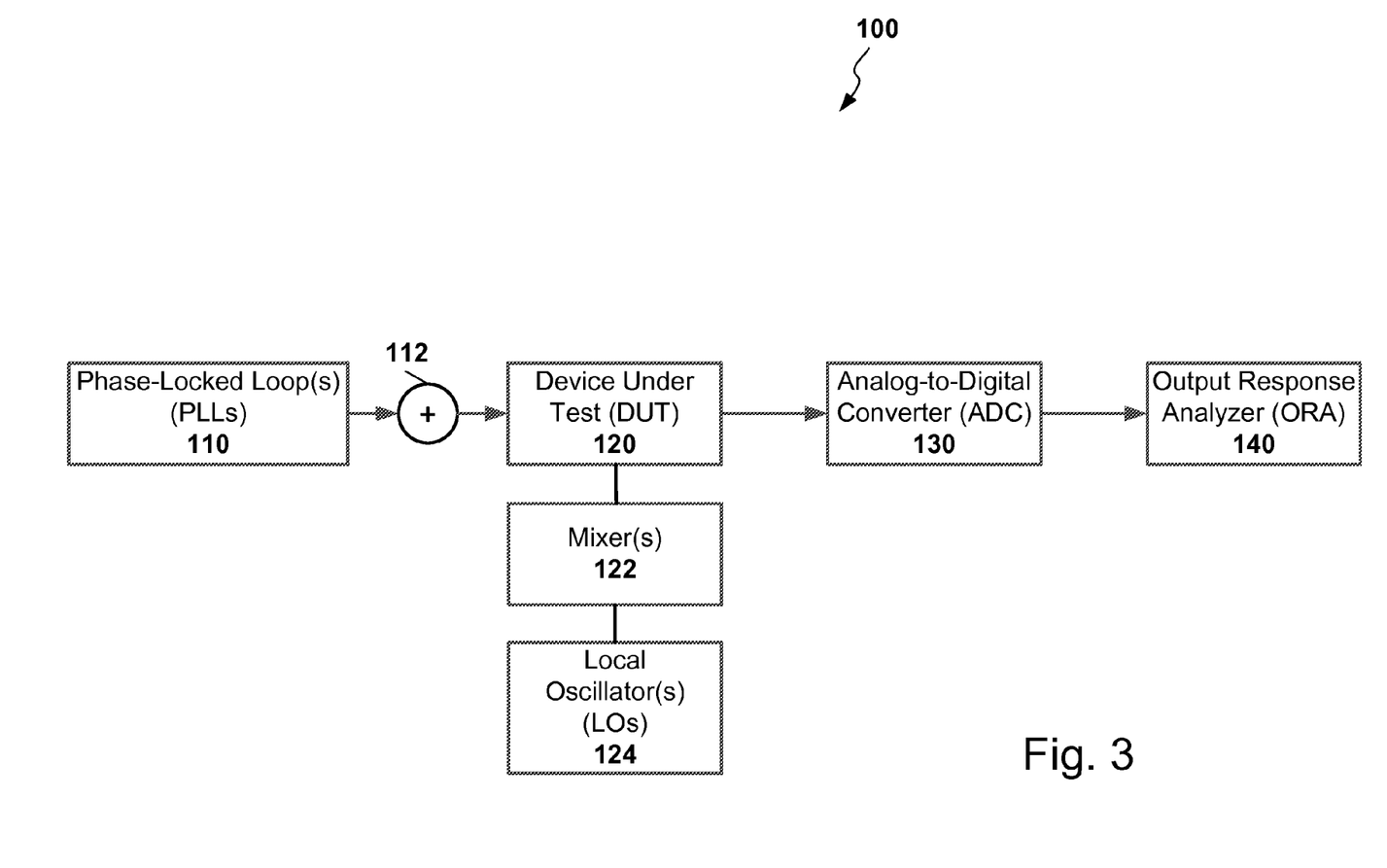
FIG. 3 illustrates a block diagram view of a hybrid analog-digital built-in self-test of radio frequency performance of a system, configured in accordance with an embodiment of the present invention.

FIG. 3 illustrates a block diagram view of a hybrid analog-digital built-in self-test of radio frequency performance of a device under test, configured in accordance with an embodiment of the present invention. As can be seen, a hybrid analog-digital BIST architecture 100 for determining RF performance may include, for example, one or more PLLs 110, a device under test 120 which in this example includes or is otherwise operatively coupled to one or more mixers 122 and one or more local oscillators 124, an analog-to-digital converter 130, and an output response analyzer 140. Furthermore, the BIST architecture 100 optionally may include a summer 112 when multiple PLLs 110 are utilized. As will be appreciated in light of this disclosure, numerous variations and alternate configurations of the BIST architecture 100 can be used in accordance with an embodiment of the present invention, and the claimed invention is not intended to be limited to any particular configuration or circuit architecture.

Figure 4:
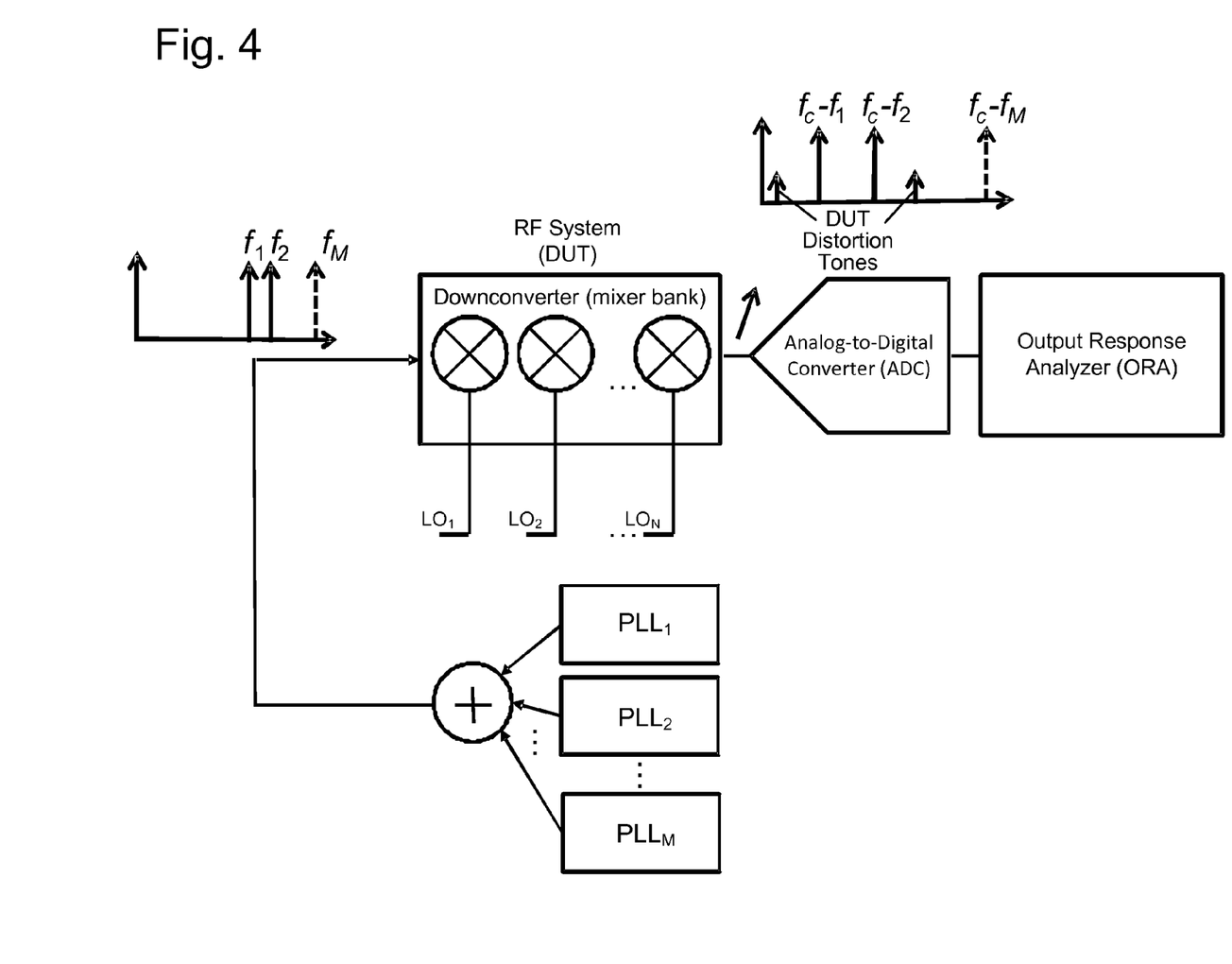
FIG. 4 illustrates a schematic view of a hybrid analog-digital built-in self-test of radio frequency performance of a system, configured in accordance with an embodiment of the present invention.

FIG. 4 illustrates a schematic view of a hybrid analog-digital built-in self-test of radio frequency performance of a device under test, configured in accordance with an embodiment of the present invention. In this example case, the DUT is an RF system that includes a downconverter configured with one or more mixers that mix the received RF signal with the LO signal to downconvert from the RF frequency band to the intermediate frequency band. The RF system may have other components for which BIST capability is provided as well. In one specific example case, the RF system under test is an RF receiver implemented in a system-on-chip configuration. The local oscillators may be on or off chip.

As used hereinafter, $f_1, f_2, \ldots f_M$ are arbitrary test tones, and $f_c$ is the aggregate conversion frequency created through the system. As can be seen, in some embodiments, one or more PLLs (e.g., $PLL_1, PLL_2, \ldots PLL_M$) may be utilized in the BIST architecture. In embodiments utilizing only a single PLL, such as $PLL_1$, to generate a single arbitrary analog tone, such as $f_1$, the gain and/or phase of the RF system under test may be measured. In embodiments utilizing two or more PLLs, such as $PLL_1$ and $PLL_2$, to generate a corresponding at least two arbitrary analog tones, such as $f_1$ and $f_2$, the distortion of the RF system under test also may be measured. In some embodiments, multiple PLLs, such as $PLL_1, PLL_2, \ldots PLL_M$, may be used to generate a corresponding multiple arbitrary analog tones, such as $f_1, f_2, \ldots f_M$, respectively. In embodiments utilizing at least two PLLs, an optional summer may be operatively connected to the PLLs and allowed to sum the multiple arbitrary analog tones from the multiple PLLs into a single analog stimulus signal. As will be appreciated in light of this disclosure, a multi-loop ring oscillator or multiple independent ring oscillator circuits each configured with an appropriate number of inverters can be used in place of the multiple PLLs. Other types of suitable oscillator circuitry will be apparent in light of this disclosure, such as Colpitts, Clapp, and emitter/source-coupled oscillator circuitry.

With such a PLL/oscillator based approach, a stimulus signal may be generated directly at a desired frequency, including, but not limited to, a frequency within the RF range. For example, one or more of $f_1, f_2, \ldots f_M$ may be in the range of 18 GHz±100 MHz. Thus, there is no need to first generate the stimulus signal at digital baseband frequency before digital-to-analog conversion and up-conversion to RF, as required with the approaches discussed with reference to FIGS. 1 and 2. Instead, in accordance with one embodiment of the present invention, an arbitrary RF signal may be generated directly in the RF range of interest (such as the frequency at which a receiver front-end of the RF system under test operates), thereby skipping the digital-to-analog conversion and up-conversion processes. As a result, complications arising from those processes (such as IMD and image signals) can be avoided.

In some embodiments, one or more PLLs or oscillator circuitry may be used to generate one or more continuous wave (CW) tones to be used and/or optionally summed by summer as the analog RF stimulus signal. By virtue of the linear operation of the one or more PLLs/oscillator circuitry and the summer, the resultant analog RF stimulus signal may exhibit characteristics of minimal and/or no modulation (or otherwise negligible). In accordance with an embodiment of the present invention, the analog RF stimulus signal may be generated on the test-tone side. In other embodiments, the analog test tones $f_1, f_2, \ldots f_M$ generated by the PLLs/oscillator circuitry may be generated separately from one another not summed until they reach a summer in the front end of the DUT. Thus, the DUT itself may be used to some extent to prepare the RF stimulus signal used in testing the DUT.

The DUT may be any device desired that is to undergo RF performance testing. In some embodiments, the DUT may include one or more mixer banks and/or any other componentry typical of an RF receiver. In some embodiments, a given mixer bank may include one or more mixers operatively coupled with one another and configured to mix an incoming analog RF stimulus signal with one or more signals output from one or more LOs (e.g., $LO_1, LO_2, \ldots LO_N$) operatively coupled with such mixers. Within such a mixer bank, down-conversion of the analog RF stimulus signal may occur. Such down-conversion may bring the analog RF stimulus signal down to, for example, baseband or other suitable intermediate frequency range. As a result, the mixer bank of the DUT may output a down-converted analog signal $f_c$-$f_1$, $f_c$-$f_2$, ... $f_c$-$f_M$ and one or more DUT distortion tones (as best shown in FIG. 4) resulting from the downconversion process of the DUT. The down-converted analog signals $f_c$-$f_1$, $f_c$-$f_2$, ... $f_c$-$f_M$ may be in the range, for example, of 1 GHz±100 MHz. The output of the DUT subsequently may be sampled by an ADC and/or analyzed by an ORA. Note that in other embodiments, an analog output response analyzer can be used thereby eliminating the need for an analog-to-digital conversion at the output of the DUT. Given that any distortion and/or other changes in the resultant output signal are associated solely with the DUT, such effects may be measured directly and any issues or problems with the DUT may be determined and/or diagnosed.

As will be appreciated, the BIST architecture provided herein does not need to have dynamic range that matches the DUT. Rather, linearity can be tested independently of noise figure. Thus, for instance, a two-tone test pattern only needs to be free of distortion; it does not need to have a high quality tank. In some embodiments, the BIST architecture may be designed, in part or in whole, to function on a circuit board and/or on an integrated circuit chip or chip set.

In some embodiments, the total amount of time required for completion of the BIST may be, for example, less than or equal to 1 second, 5 seconds, 10 seconds, 15 seconds, or 20 seconds, or higher, depending on the nature of the testing being done (e.g., number of measurements being made and/or desired measurement precision, etc) and factors such as any dwell time that is required by a given test, sampling rate of ADC. In short, the claimed invention is not intended to be limited to the particulars of any testing regime.

Figure 5:
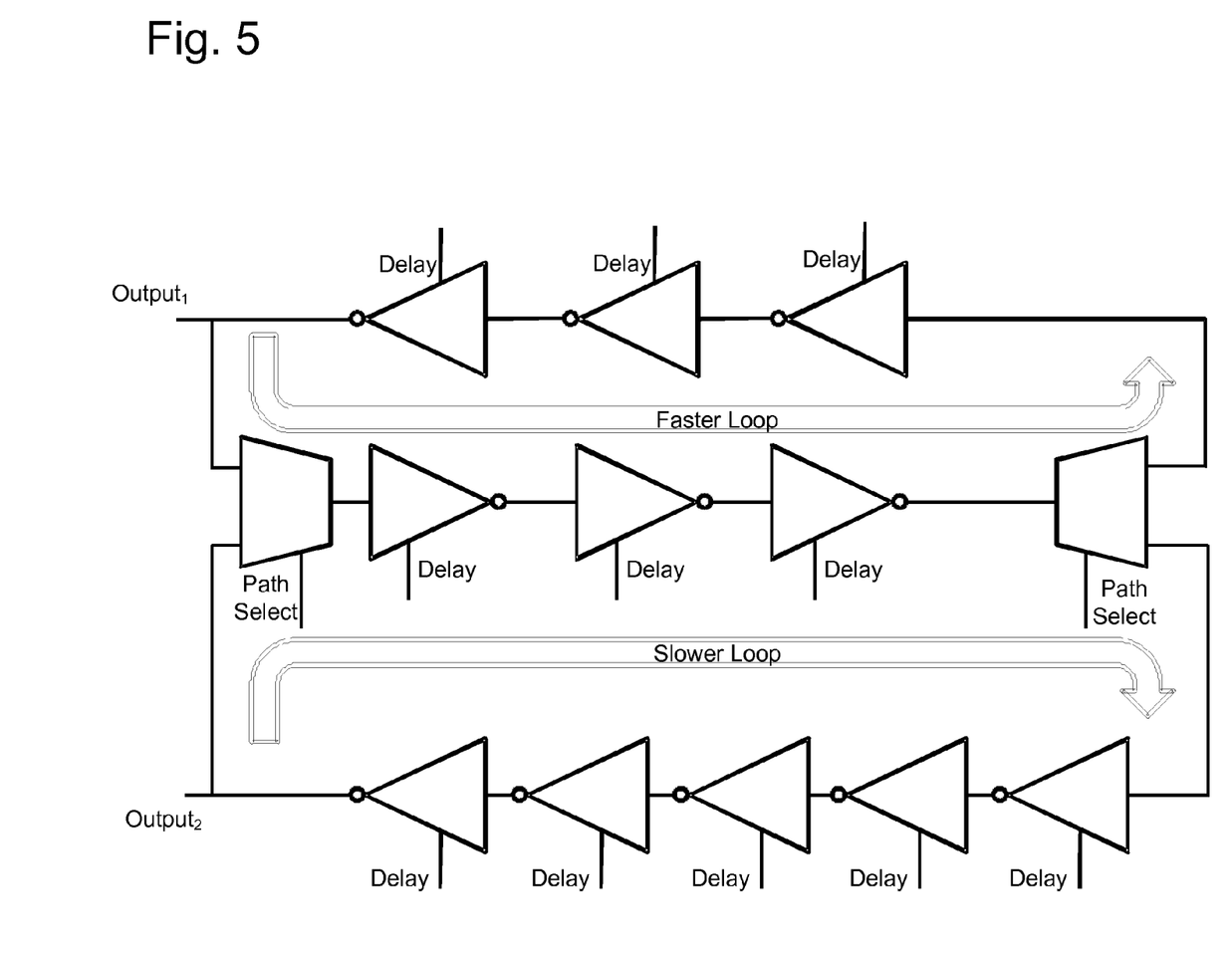
FIG. 5 illustrates a schematic view of a multi-loop ring oscillator for generating stimulus signals in accordance with an embodiment of the present invention.

In some embodiments, the generation of the stimulus signals may be implemented with a multi-loop oscillator configuration (e.g., a multi-loop ring oscillator). In general, a multi-loop oscillator configuration allows for a very wide frequency range of signals to be generated. FIG. 5 illustrates a schematic view of a multi-loop ring oscillator that can be used to generate analog stimulus signals in accordance with an embodiment of the present invention. The logic gates of such a ring oscillator are inverters, and can be implemented using any number of process technologies as commonly done (e.g., CMOS, pseudo-NMOS, and ECL). The example embodiment shown in FIG. 5 is configured with CMOS inverters.

As can be seen, the ring oscillator is configured an odd number of inverters, each contributing to the delay of the signal around the corresponding loop/ring. Pairs of inverters can be added to the ring to increase the total delay and decrease the oscillator frequency; likewise, taking away inverter pairs decreases the total delay and increases the oscillator frequency. In addition, changing the supply voltage changes the delay through each inverter where, for example, higher voltages decrease delay and increase the oscillator frequency.

Thus, one or more of the inverters may include a delay line (e.g., supply voltage input) operatively coupled thereto. Such delay lines may be used to change the propagation time through one or more of the inverting stages. Adjustment of the propagation time via such delay lines may be achieved by, for example, current starving and/or varactor tuning The multi-loop ring oscillator configuration further includes a path select function. By utilizing such a path select function (e.g., multiplexor or single pole multi-throw switch), one of several paths including, but not limited to, a faster loop (higher frequency stimulus signal) and a slower loop (lower frequency stimulus signal) may be chosen. In the example embodiment shown, a faster loop/high frequency stimulus signal is provided that includes a chain of three inverters, and a slower loop/low frequency stimulus signal that includes a chain of five inverters (not counting the inverter and path select devices common to both loops). The at least two different stimulus signals can be provided at the corresponding outputs (e.g., output$_1$ and output$_2$). Note these two signals can be mixed or otherwise used to provide another signal that is used as the DUT stimulus signal.

As previously explained, any number of suitable oscillator circuits can be used, and the claimed invention is not intended to be limited to ring oscillator configurations. Rather, any suitable oscillator topology can be used whether harmonic or relaxation type topology, such as Armstrong oscillator, Clapp oscillator, Colpitts oscillator, cross-coupled LC oscillator, delay line oscillator, emitter-coupled oscillator, Hartley oscillator, multivibrator, opto-electronic oscillator, phase-shift oscillator, Pierce oscillator, RC oscillator, source-coupled oscillator, or Vackar oscillator. In some specific embodiments, any oscillator architecture that can be readily implemented within an integrated circuit fabrication process (e.g., CMOS) is used, such as multi-loop ring or delay line oscillators or emitter/source-coupled oscillators. In a more general sense, any oscillator circuitry that can generate the desired test signals can be used, such as a switchable bank of crystal oscillators. Numerous oscillator circuit configurations will be apparent in light of this disclosure.

Methodology

Figure 6:
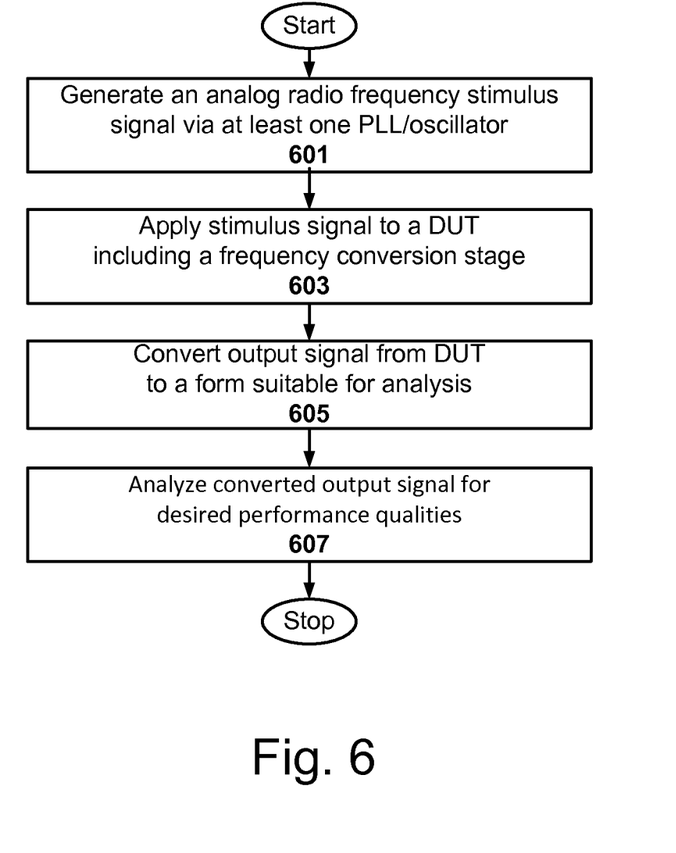
FIG. 6 is a flow diagram illustrating a method of performing a built-in self-test of radio frequency performance of a system, configured in accordance with an embodiment of the present invention.

FIG. 6 is a flow diagram illustrating a method for performing a built-in self-test of radio frequency performance of a device under test, configured in accordance with an embodiment of the present invention. As will be appreciated, the method can be carried out by configuring the DUT circuitry to further include BIST circuitry as described herein (e.g., one or more PLLs or oscillator circuitry, ADC, ORA). In addition, the BIST circuitry may include a process that can generally execute routines that cause a given BIST profile to be carried out.

The method includes generating 601 a radio frequency stimulus signal via at least one PLL or oscillator circuitry. In other embodiments, the stimulus signal may be in any frequency range of interest, whether low or high frequency. In one example embodiment, the stimulus signal is a composite signal or otherwise derived from a plurality of signals generated by a corresponding number of PLLs or oscillator loops. In some such cases, the method may further include summing the plurality of signals to provide the desired stimulus signal.

The method continues with applying 603 the stimulus signal through a DUT including a frequency conversion stage and/or a domain conversion stage to provide an output signal. In some cases, the frequency conversion stage of the DUT is a downconversion stage (e.g., such as those used in an RF receiver), but could also be an upconversion stage (e.g., such as those used in an RF transmitter). A typical frequency conversion stage generally includes one or mixers that can mix an input signal with an LO signal to effect the desired frequency conversion process. The domain conversion stage can be, for example, an analog-to-digital conversion stage, but other conversions susceptible to IMD and/or image signals as discussed with reference to FIGS. 1 and 2 will be apparent.

The method continues with converting 605 the output signal generated by the DUT in response to the stimulus signal to a form suitable for analysis. This conversion may entail, for instance, converting from analog to the digital domain, filtering, and/or amplifying the output signal. Other signal processing may be used as well, depending on particulars of application. In other embodiments, there is no signal processing (i.e., converting 605 is optional).

The method continues with analyzing 607 the converted output signal for desired performance qualities. Any number of radio frequency performance parameters can be tested (e.g., linearity, IMD products, bandwidth, gain, etc). The ORA may be configured to implement any such tests, and the claimed invention is not intended to be limited to the specific types of testing or performance criteria.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method of performing a built-in self-test, comprising:
generating, in the analog domain, an analog radio frequency composite stimulus signal via oscillator circuitry, the composite stimulus signal being derived from a plurality of N test tones, wherein the frequency of the composite stimulus signal is generated directly by the oscillator circuitry and without upconverting a lower frequency digital signal;
applying the composite stimulus signal to a device under test (DUT), the DUT including a frequency conversion stage including at least one of a mixer and a local oscillator; and
analyzing an output signal of the DUT responsive to the composite stimulus signal for desired performance qualities;
wherein the DUT is a system-on-chip and the method is at least partially performed on-chip.

2. The method of claim 1 wherein at least a portion of the method is performed during manufacturing of the DUT.

3. The method of claim 1 wherein at least a portion of the method is performed during field testing of the DUT.

4. The method of claim 1 wherein the oscillator circuitry is included in a plurality of phase-locked loops and is configured to generate the plurality of N test tones that are included in the composite stimulus signal.

5. The method of claim 1 wherein the composite stimulus signal is unmodulated.

6. The method of claim 5 wherein the composite stimulus signal is a continuous wave tone.

7. The method of claim 1 wherein the frequency conversion stage is constructed and arranged to downconvert the composite stimulus signal.

8. The method of claim 1 wherein prior to analyzing the output signal of the DUT, the method further comprises converting the output signal to a form suitable for analysis.

9. The method of claim 8 wherein converting the output signal to a form suitable for analysis includes converting the output signal to a digital signal.

10. The method of claim 1 wherein analyzing the output signal of the DUT comprises measuring intermodulation distortion generated by the DUT.

11. The method of claim 1 wherein analyzing the output signal of the DUT comprises at least one of detecting faults in the DUT, determining calibration of the DUT, and compensating for DUT circuitry that is sensitive to one or more of temperature, supply voltage, and process variations.

12. A device for performing a built-in self-test, comprising:
oscillator circuitry for generating, in the analog domain, an analog radio frequency composite stimulus signal, the composite stimulus signal being derived from a plurality of N test tones, wherein the frequency of the composite stimulus signal is generated directly by the oscillator circuitry and without upconverting a lower frequency digital signal;
a device under test (DUT) for receiving the composite stimulus signal, and including a frequency conversion stage including at least one of a mixer and a local oscillator; and
an analyzer for analyzing an output signal of the DUT responsive to the composite stimulus signal for desired performance qualities;
wherein the device is a system-on-chip and the built-in self-test is at least partially performed on-chip.

13. The device of claim 12 wherein the oscillator circuitry is included in a plurality of phase-locked loops and is configured to generate the plurality of N test tones that are included in the composite stimulus signal via a summer included in the device.

14. The device of claim 12 wherein the frequency conversion stage is constructed and arranged to downconvert the composite stimulus signal.

15. The device of claim 12 further comprising circuitry for converting the output signal to a form suitable for analysis by the analyzer.

16. The device of claim 12 wherein the analyzer is configured for at least one of measuring intermodulation distortion generated by the DUT, detecting faults in the DUT, determining calibration of the DUT, and compensating for DUT circuitry that is sensitive to one or more of temperature, supply voltage, and process variations.

17. A device for performing a built-in self-test, comprising:
oscillator circuitry for generating, in the analog domain, an analog radio frequency composite stimulus signal, the composite stimulus signal being derived from a plurality of N test tones, wherein the frequency of the composite stimulus signal is generated directly by the oscillator circuitry and without upconverting a lower frequency digital signal;
a device under test (DUT) for receiving the composite stimulus signal, and including a frequency conversion stage including at least one of a mixer and a local oscillator;
circuitry for converting an output signal of the DUT responsive to the composite stimulus signal to a form suitable for analysis; and
an analyzer for analyzing the output signal for desired performance qualities;
wherein the device is a system-on-chip and the built-in self-test is at least partially performed on-chip.

18. The device of claim 17 wherein the oscillator circuitry is included in a plurality of phase-locked loops and is configured to generate the plurality of N test tones that are included in the composite stimulus signal via a summer included in the device.

* * * * *